June 20, 1967 G. ABRAHAM 3,327,136

VARIABLE GAIN TUNNELING

Filed March 30, 1964

INVENTOR
GEORGE ABRAHAM

BY Richard C Reed

ATTORNEY 3,327,136
VARIABLE GAIN TUNNELING
George Abraham, 3107 Westover Drive SE., Washington, D.C. 20020
Filed Mar. 30, 1964, Ser. No. 355,979
2 Claims. (Cl. 307—88.5)

The invention described herein may be manufactured and used by or for the Government of the United States of America for governmental purposes without the payment of any royalties thereon or therefor.

The present invention relates to negative resistance generation and more particularly to quantum-mechanical tunneling.

The phenomenon of quantum-mechanical tunneling was first reported by Esaki, "New Phenomenon in Narrow Ge p-n Junctions," Physical Review, v. 109, p. 603, 1958. The result of his discovery led to the development of the device known as the tunnel diode, an abrupt junction diode made of very highly doped semi-conductor material which produces a negative resistance for small forward bias. The advantages of such a device are many. Besides being small in size and having low power dissipation, the tunnel diode provides operation as an active device at frequencies from D-C up to the kilo-megacycle region. The tunnel diode, however, being a two terminal device is limited in application. Three terminal devices capable of supporting the tunnel action have been developed as an answer to this limitation. These devices, however, are specially manufactured to provide the desired negative resistance characteristics, the high doping requirements of the tunnel diode being rigidly followed, so as to render these devices at all times degenerate in order that tunnel operation may occur.

It is an object of the present invention, therefore, to provide a three terminal tunneling device without resort to special manufacture.

Another object of the present invention is to provide a method of obtaining a three terminal tunneling device by the use of presently available transistors.

Another object of the present invention is to provide controlled-gain tunneling.

A further object of the present invention is to create the conditions necessary for quantum-mechanical tunneling in presently-available normally nondegenerate transistors.

The nature of this invention as well as other objects and advantages thereof will be readily apparent from consideration of the accompanying drawings, in which.

Figure 1:
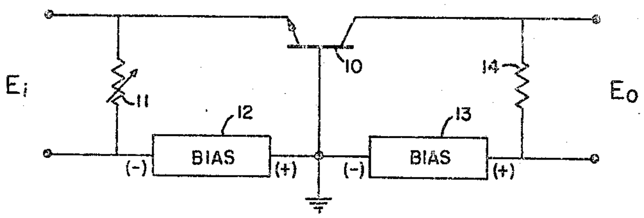
FIGURE 1 is a combined block and circuit diagram of the preferred embodiment of the present invention.

FIGURE 1 shows a transistor 10 having its emitter-base junction biased in a forward direction by bias 12 via variable resistor 11, and having its collector-base junction reverse-biased by bias source 13 via load resistor 14. The signal input to the circuit is across the variable resistor 11 and the output is taken across load resistor 14. Resistor 11 provides emitter current regulation, which could as readily be provided by the use of a variable bias source instead of the fixed bias-variable resistor combination shown. It should also be understood that transistor 10, shown as a NPN, could be replaced by a PNP transistor without deviating from the results obtained. With this change, the polarities of the bias supplies 12 and 13 would be reversed.

Figure 2:
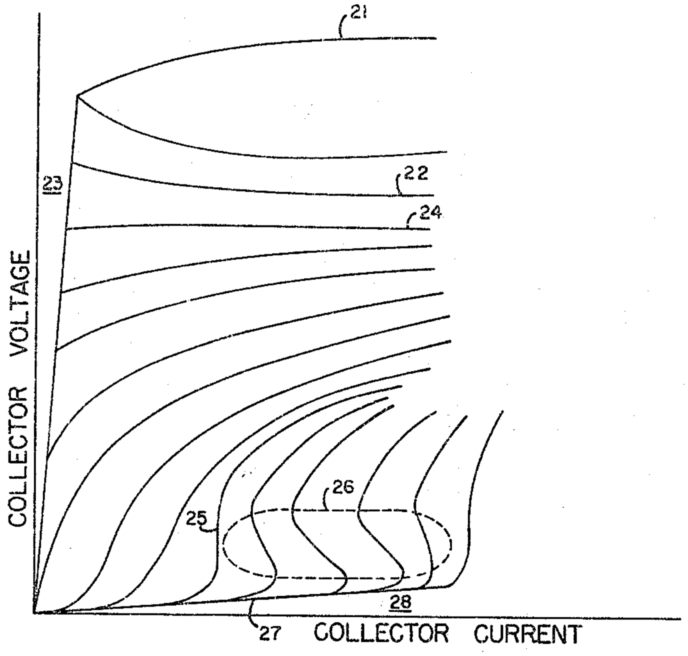
FIGURE 2 illustrates the complete collector characteristics of a NPN transistor.

FIGURE 2 shows the complete collector characteristics of a NPN transistor with the various regions of different operation noted. These regions are tabulated as follows:

Regions 21 and 22 designate current-controlled negative resistance due to avalanche breakdown. Region 23 is the cutoff region of the transistor. Constant voltage operation is designated 24. Region 25 depicts constant current operation. Region 26 is a negative mass region of particular interest to the present invention. These curves are voltage-controlled negative resistance. Region 27 is a second area of constant voltage, and region 28 designates the point of saturation of the transistor. Our attention is drawn to region 26. In this region of low collector voltage negative resistance has heretofore not been observed. The failure to observe this phenomenon in the transistor is due primarily to the requirements necessary for quantum-mechanical tunneling, normally not to be found in the transistor. With this consideration in mind, the theory of operation and the parameters required to support tunneling in a normally nondegenerate, two-junction semiconductor device is presented.

*Theory of operation*

The parameters requisite to support tunneling action across a PN semiconductor junction have been carefully noted in the art since the effect was discovered and explained by Esaki in 1958. These requirements of the tunnel diode are degenerate doping of the semiconductor material about the junction. For example, in germanium the order of $10^{19}$ impurities per cubic centimeter provides an abrupt transition from N-type to P-type regions in the neighborhood of 100 Angstrom units in width, another prerequisite to tunneling.

The operation of the tunnel diode has been described as follows:

At zero bias the tunneling in both directions is equal so that the net current is zero. With slight forward bias a few electrons from the conduction band of the N region tunnel through the narrowed transition region entering empty states of the now adjacent valence band of the P region. This current increases as the bias is increased (positive incremental resistance), until such time as the bands begin to "uncross" and the tunnel current decreases with applied voltage (region of negative resistance). When the bands are completely "uncrossed" tunneling ceases and normal injection predominates, increasing with voltage in a somewhat exponential form, the incremental device resistance becoming positive.

In a three-terminal two-junction semiconductor device, such as the transistor, it is possible to obtain tunneling without first doping the material about a junction into a degenerate state. Having selected a transistor with an impurity concentration lower than that required for tunneling, yet sufficiently high so that it is possible to bias the transistor into that range without biasing to a degree capable of destroying the device, it is possible to create the conditions requisite for tunneling using a normally nondegenerate device. Such a device can be a germanium transistor, for example, having an impurity concentration in the order of $10^{16}$ to $10^{18}$ per cubic centimeter. Upon the application of normal transistor biasing, i.e. forward-biasing the emitter-base junction and reverse-biasing the collector-base junction, the following phenomena are realized. The forward-bias across the emitter-base junction causes minority carrier injection from the emitter to the base and majority carrier flow into the base from the external circuit. Normal collector action causes that portion of the minority carriers that have not recombined to be swept into the collector due to the field induced by the reverse-bias of the collector-base junction. In the case of a PNP transistor, for example, at low level injection, the electrons will tend to distribute themselves within the base in such a manner and in such numbers as to neutralize the positive space charge represented by the acceptors and the diffused holes so that their density and distribution are essentially equal. However, as the injection level rises, additional electrons are admitted into the base from the external circuit and, due to the collector action providing an exit for many of the holes diffused into the base from the emitter, are left in an abundance to distribute themselves in a gradiant of electron density high at the emitter-base junction to low density at the collector-base junction.

The internal electric field created by this electron gradient enhances further diffusion across the emitter-base junction. The resistivity of the base region near the emitter under these conditions is rapidly lowered placing the region in a degenerate state with a transition region in the emitter base junction narrow enough to allow for quantum-mechanical tunneling. This phenomenon is thus realizable with transistors normally nondegenerate yet so highly doped about the emitter-base junction as to become degenerate upon the application of properly polarized bias in amounts below that causing burnout.

Four alternative combinations of emitter-base doping supporting tunneling are available. Degeneracy in both the base and emitter regions has been described in the art. Three other possibilities within the purview of the present invention present themselves. The first condition is to have both emitter and base regions highly doped, but below that required for tunneling. This condition is described above. A second and third possibility is to have one of said regions doped in this manner while the other is doped degenerate. In practice the emitter is more highly doped than the base to provide good injection efficiency.

The role played by the emitter-base bias is many fold. Applied in a positive direction in the above-described process across the emitter-base junction, injection of minority carriers, holes in the case of the PNP transistor, into the base region, and electron flow into the base via the base lead is effected. Increasing this bias in the presence of the reverse-bias across the collector-base junction causes the generation of an electric field in the base which enhances further diffusion, lowering the resistivity of the base region, approaching degeneracy in that region, and the resultant quantum-mechanical tunneling. This procedure toward the degeneracy of the base region is, in other words, a procedure of increasing, the relative energy levels of the charge carriers in the base and emitter regions, so that the electrons at the bottom of the conduction band of the base are at the same energy level as the empty states of the valence band of the emitter, allowing electrons to tunnel through a narrowed emitter-base potential barrier.

A third function provided by the emitter-base bias is extrinsic to this process of creating the conditions for tunneling. By varying the emitter current, which is in fact varying the rate of minority carrier injection, or, in effect, varying the slope of the negative resistance portion of the negative resistance curve caused by the tunneling action, the amplification of this curve is varied. Variable gain tunneling is thus realizable with the transistor. The gain can be varied within the range of tunneling as shown by region 26 in FIGURE 2. Experimentally, this has been found to extend from 0.20 to 0.40 of a volt emitter-base bias in a germanium transistor.

Quantum-mechanical tunneling has heretofore not been recognized as possible in semiconductors unless the materials on both sides of the PN junction have been previously doped to degeneracy. This requirement is now shown to be less than absolutely essential.

The bias required to induce the degenerate action described is far below the voltage range required for avalanche breakdown of reverse-biased junctions, and obviously is of the wrong polarity. The voltage-controlled negative resistance characteristic produced and the speed of performance are all factors supporting the theory of quantum-mechanical tunneling.

It should be understood that while the grounded-base configuration of the transistor has been shown in the drawings, the grounded-emitter or grounded-collector configurations could easily have been used.

Since various changes and modifications may be made in the practice of the invention herein described without departing from the spirit or scope thereof, it is intended that the foregoing description shall be taken primarily by way of illustration and not in limitation except as may be required by the appended claims.

What is claimed is:

1. A junction transistor circuit for receiving an input signal comprising:

a transistor having an emitter, base and collector and having an impurity concentration in at least one of the emitter and base regions below that required for tunneling but above a predetermined minimum, said emitter and base forming an emitter-base junction, and said collector and base forming a collector-base junction, means coupled to said emitter-base junction for forward-biasing said emitter-base junction for causing minority carrier injection into the base and majority carrier flow into the base from the external circuit, means coupled to said collector-base junction for reverse-biasing the collector-base junction of said transistor to cause normal collector action and for sweeping a portion of said minority carriers into the collector, means for further biasing said emitter-base junction to increase said injection and flow into the base until an electric field is created from the unneutralized charge in the base region, for further increasing the mobile charge density in the base near the emitter and for narrowing the thickness of the emitter-base potential barrier from that established by said impurity concentration to permit quantum-mechanical tunneling, and means coupled to said transistor for varying the gain of said tunneling without changing the amplitude of the input signal to said transistor circuit by regulating the bias across the emitter-base junction.

2. A transistor circuit comprising:

a transistor having an emitter, base and collector with said emitter and base forming an emitter-base junction, and said collector and base forming a collector-base junction, said emitter-base junction width being greater than that required for quantum-mechanical tunneling yet sufficiently narrow to permit such action when proper bias is applied, means coupled to said emitter-base junction for forward-biasing said emitter-base junction of said transistor to cause minority carrier injection from the emitter into the base and majority carrier flow into the base, means coupled to said collector-base junction for reverse-biasing said collector-base junction of said transistor to cause normal collector action and sweeping a portion of the minority carriers into the collector, and means for further biasing said emitter-base junction to increase said injection and flow into the base until the distribution of surplus majority carriers in the base forms a charge concentration gradient with a high value of charge density at the emitter-base junction to a low value of charge density at the collector-base junction, wherein the width of said emitter-base junction is effectively reduced to permit quantum-mechanical tunneling.

References Cited

UNITED STATES PATENTS

| | | | |
|---|---|---|---|
| 2,896,168 | 7/1959 | Thomas | 307—88.5 |
| 2,962,605 | 11/1960 | Grosvalet | 317—234 |
| 3,079,512 | 2/1963 | Rutz | 317—234 |
| 3,219,837 | 11/1965 | Nakahara | 317—235 |
| 3,245,002 | 4/1966 | Hall | 317—234 X |
| 3,260,624 | 7/1966 | Wiesner | 317—235 X |

ARTHUR GAUSS, *Primary Examiner.*

B. P. DAVIS, *Assistant Examiner.*